(12) United States Patent
Mei et al.

(10) Patent No.: US 10,310,172 B2
(45) Date of Patent: Jun. 4, 2019

(54) APPARATUS FOR INSTALLING LED LIGHT BAR AND METHOD OF INSTALLING LED LIGHT BAR

(71) Applicants: BOE TECHNOLOGY GROUP CO., LTD., Beijing (CN); BOE OPTICAL SCIENCE AND TECHNOLOGY CO., LTD., Suzhou (CN)

(72) Inventors: Yuqi Mei, Beijing (CN); Chunlei Cao, Beijing (CN); Ying Zang, Beijing (CN); Haiyan Wang, Beijing (CN)

(73) Assignees: BOE TECHNOLOGY GROUP CO., LTD., Beijing (CN); BOE OPTICAL SCIENCE AND TECHNOLOGY CO., LTD., Suzhou (CN)

( * ) Notice: Subject to any disclaimer, the term of this patent is extended or adjusted under 35 U.S.C. 154(b) by 288 days.

(21) Appl. No.: 15/142,878

(22) Filed: Apr. 29, 2016

(65) Prior Publication Data

US 2016/0320030 A1  Nov. 3, 2016

(30) Foreign Application Priority Data

Apr. 30, 2015  (CN) .......................... 2015 1 0218137

(51) Int. Cl.
*H05K 3/32* (2006.01)
*H05K 13/04* (2006.01)
(Continued)

(52) U.S. Cl.
CPC ............. *G02B 6/009* (2013.01); *H05K 3/303* (2013.01); *H05K 13/0015* (2013.01);
(Continued)

(58) Field of Classification Search
CPC ...... H05K 13/046; H05K 13/04; H05K 13/00; H05K 13/0015; H05K 13/02; H05K 3/303;
(Continued)

(56) References Cited

U.S. PATENT DOCUMENTS 4,715,112 A  * 12/1987 Jackson ............. H05K 13/0413
                                                    29/739
4,733,459 A  *  3/1988 Tateno ............... B65G 47/8884
                                                    198/463.6

(Continued)

*Primary Examiner* — Peter Dungba Vo
*Assistant Examiner* — Kaying Kue
(74) *Attorney, Agent, or Firm* — Ladas & Parry LLP; Lauren K. Thompson

(57) ABSTRACT

An apparatus for installing LED light bar is provided. The apparatus includes a platform at which a component with a LED light bar to be installed is placed; a rotatable arm and a first driving device disposed on a side of the platform. The rotatable arm is provided with a locating member, and one end of the arm is fixed relative to the platform; the first driving device drives the arm to rotate about the fixed end from a first position to a second position. When the arm is located at the first position, the LED light bar to be installed may be placed at the arm, and the locating member may fix the LED light bar on a predetermined position of the arm; when the arm rotates to the second position, the LED light bar adheres to the surface of the component for installing the LED light bar thereon.

18 Claims, 2 Drawing Sheets

(51) Int. Cl.
*F21V 8/00* (2006.01)
*H05K 3/30* (2006.01)
*H05K 13/00* (2006.01)
*H05K 13/02* (2006.01)

(52) U.S. Cl.
CPC ............ *H05K 13/02* (2013.01); *H05K 13/04* (2013.01); *H05K 13/046* (2013.01); *Y10T 29/53178* (2015.01)

(58) Field of Classification Search
CPC ......... Y10T 29/53174; Y10T 29/53178; F21V 19/00; F21V 8/00; G02B 6/009
USPC .................................. 29/729–761, 834, 832
See application file for complete search history.

(56) References Cited

U.S. PATENT DOCUMENTS

| | | | | |
|---|---|---|---|---|
| 4,797,994 | A * | 1/1989 | Michaud | H01L 21/67144 29/720 |
| 5,287,616 | A * | 2/1994 | Suzuki | H05K 13/0413 29/740 |
| 6,248,201 | B1 * | 6/2001 | Boyd, IV | H01L 21/67132 156/230 |
| 2005/0268457 | A1 * | 12/2005 | Ebihara | H05K 13/0413 29/740 |
| 2014/0239331 | A1 * | 8/2014 | Oyu | H05K 13/046 257/98 |

\* cited by examiner

APPARATUS FOR INSTALLING LED LIGHT BAR AND METHOD OF INSTALLING LED LIGHT BAR

TECHNICAL FIELD

Embodiments of the present disclosure relate to an apparatus for installing a light-emitting diode (LED) light bar and a method of installing a LED light bar.

BACKGROUND

A liquid crystal display device may include a liquid crystal panel and a backlight module, and the backlight module provides lights for displaying images. A backlight module may use a light emitting diode (LED) as a light source, and a light guide plate is used to diverge light emitted by the LED, so that a backlight module that can uniformly emit light is formed. Since a lot of LEDs are used, it needs to fix the plurality of LEDs on the LED light bar and then assembles the LED light bar with the light guide plate. For example, an installing groove may be provided on the light guide plate, and the LED light bar is correspondingly installed within the installing groove, or the LED light bar is directly adhered to corresponding surface of the light guide plate.

SUMMARY

The disclosure provides an apparatus for installing a light-emitting diode (LED) light bar and a method of installing a LED light bar.

According to at least one embodiment, an apparatus for installing a LED light bar is provided, which includes: a platform at which a component with a LED light bar to be installed is placed; a rotatable arm and a first driving device disposed on a side of the platform. The rotatable arm is provided with a locating member, and one end of the rotatable arm is fixed relative to the platform. The first driving device is configured to drive the rotatable arm to rotate about the fixed end from a first position to a second position; at the first position, the LED light bar may be placed at the rotatable arm, and the locating member is configured to fix the LED light bar on a predetermined position of the rotatable arm; at the second position, a surface of the rotatable arm on which the LED light bar is fixed is opposite and parallel to a surface of the component with the LED light bar to be installed thereon, and the LED light bar adheres to the surface of the component with the LED light bar to be installed thereon.

According to at least one embodiment, a method of installing a LED light bar is provided. The method includes: providing a component with a LED light bar to be installed on a platform, wherein a rotatable arm and a first driving device are disposed on a side of the platform, the rotatable arm is provided with a locating member, and one end of the rotatable arm is fixed relative to the platform; and driving the rotatable arm to rotate about the fixed end of the rotatable arm from a first position to a second position by the first driving device; when the rotatable arm is located at the first position, the LED light bar to be installed is placed at the rotatable arm, and the locating member fixes the LED light bar on a predetermined position of the rotatable arm; when the rotatable arm is located at the second position, a surface of the rotatable arm on which the LED light bar is fixed is opposite and parallel to a surface of the component with the LED light bar to be installed thereon, and the LED light bar is attached to the surface of the component with the LED light bar to be installed thereon.

BRIEF DESCRIPTION OF THE DRAWINGS

Embodiments of the present invention will be described in detail hereinafter in conjunction with accompanying drawings to allow one of ordinary skill in the art to understand the present invention more clearly, in which.

DETAILED DESCRIPTION

Technical solutions according to the embodiments of the present disclosure will be described clearly and completely as below in conjunction with the accompanying drawings of embodiments of the present disclosure. It is apparent that the described embodiments are only a part of but not all of exemplary embodiments of the present disclosure. Based on the described embodiments of the present disclosure, various other embodiments can be obtained by those of ordinary skill in the art without creative labor and those embodiments shall fall into the protection scope of the present disclosure.

The terms "first", "second", "third" and "fourth" are used merely for illustrative purposes, and are not intended to indicate or imply relative importance or numbers or amounts of a feature. Therefore, the features defined with "first", "second", "third" and "fourth" may definitely or implicitly include one or more such features. Term "a plurality of" refers to two or more unless otherwise defined herein.

The inventors notice that in the procedure of installing a light-emitting diode (LED) light bar on a light guide plate manually, the efficiency of installing the LED light bar is low since the manual operation has a low efficiency, and the manual installing process has a low accuracy. It is hard to achieve accurate installing, and the product has a low quality.

Figure 1:
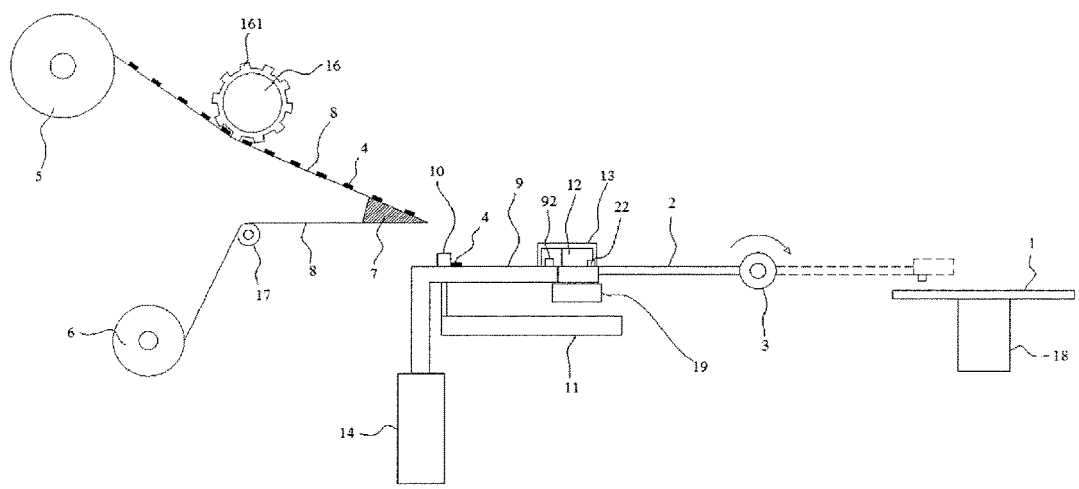
FIG. 1 is a front view of an apparatus for installing a LED light bar according to an embodiment of the disclosure.
Figure 2:
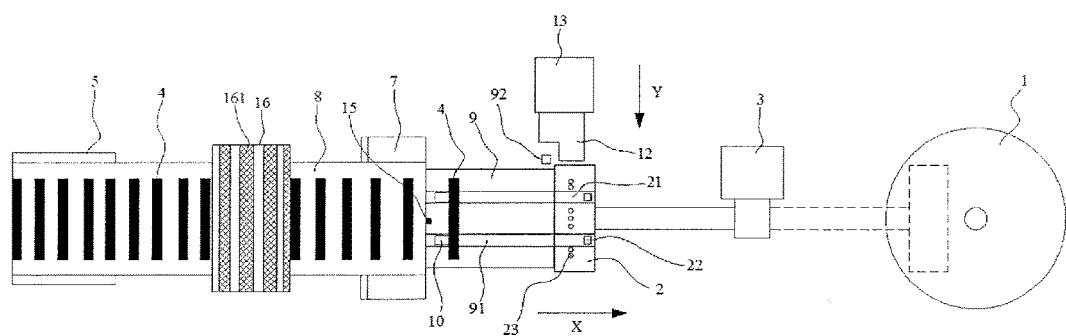
FIG. 2 is a top view of the apparatus for installing the LED light bar according to an embodiment of the present disclosure.

FIGS. 1 and 2 show an example of an apparatus for installing a light-emitting diode (LED) light bar provided by an embodiment of the present disclosure. The apparatus for installing the LED light bar includes a platform 1, a rotatable arm 2 and a first driving device 3. The platform 1 has a surface in horizontal on which a component (not shown) with a LED light bar to be installed may be placed. The component is provided with an installing groove (not shown) for installing the LED light bar. The rotatable arm 2 is located on a side of the platform 1, and one end of the rotatable arm 2 is fixed relative to the platform 1. The first driving device 3 may drive the rotatable arm 2 to rotate about the fixed end and move from a first position to a second position. The arrow in FIG. 1 shows a direction of the rotatable arm 2 rotating from the first position to the second position. When the rotatable arm 2 is located at the first position, the LED light bar 4 to be installed may be placed on the rotatable arm 2, and a locating member is disposed on the rotatable arm 2, and the LED light bar 4 may be fixed on a predetermined position of the rotatable arm 2 by the locating member. When the rotatable arm 2 rotates to the second position, a surface of the rotatable arm 2 on which the LED light bar 4 is fixed is opposite and parallel to a surface of the component with the LED light bar 4 to be installed thereon. The predetermined position is opposite to the installing groove of the component, which is provided to install the LED light bar 4, or the LED light bar 4 adheres to the surface of the component with the LED light bar 4 to be installed thereon. The rotatable arm 2 may press the LED light bar 4 into the installing groove when the rotatable arm 2 rotates to the second position.

When the apparatus for installing the LED light bar provided by the present embodiment operates, the component is placed on the horizontal surface of the platform 1, and the rotatable arm 2 is located at the first position, the LED light bar 4 to be installed is placed at the predetermined position of the rotatable arm 2 and is fixed by the locating member. After that, the first driving device 3 drives the rotatable arm 2 to rotate about its fixed end and moves from the first position to the second position. When the rotatable arm 2 rotates to the second position, the surface of the rotatable arm 2 on which the LED light bar 4 is fixed is opposite and parallel to the surface of the component for installing the LED light bar 4 thereon, so that the LED light bar 4 is snap into the groove, or the LED light bar 4 adheres to the surface of the component with the LED light bar 4 to be installed thereon. The predetermined position is opposite to the installing groove of the component, and the rotatable arm 2 may press the LED light bar 4 into the installing groove to assemble the LED light bar with the component, which avoids installing the LED light bar on the component through manual operation, and improves the installing efficiency. Meanwhile, it may preset the length of the rotatable arm 2, the position of fixing the LED light bar 4 on the rotatable arm 2, and the relative position between the rotatable arm 2 and the platform 1, and keep them constant. It is beneficial to locate the LED light bar 4 and improve the installing efficiency, and the installing accuracy can be kept even after being used many times. Therefore, it can improve accuracy and efficiency of installing the LED light bar.

It is noted that the component may be a light guide plate or other components required to be installed with the LED light bar. The component may not be provided with the groove as stated above, instead, the LED light bar 4 is adhered with the component by an adhesive. During installing the light bar, the rotatable arm 2 may rotate to press the LED light bar 4 on the position of the component for adhering the LED light bar thereon.

To further improving the installing efficiency, the apparatus for installing LED light bar further includes a feeding unit. The feeding unit includes a feeding platform 9, a first pushing block 10 and a third driving device 11. The first pushing block 10 is slidably connected to the feeding platform 9. When the rotatable arm 2 is located at the first position, the third driving device 11 may move the first pushing block 10 along a first direction so that the first pushing block 10 may push the LED light bar 4 from the feeding platform 9 to the rotatable arm 2 along the first direction, to enable automatic feeding and further improve the installing efficiency. The third driving device 11 may control the distance of the first pushing block 10 moving in the first direction, so as to control the position of the LED light bar 4 in the first direction, and accurately push the LED light bar 4 to the predetermined position of the rotatable arm 2, and it may reduce manual adjustment to the position of the LED light bar 4, and improve the installing accuracy and efficiency.

For further improving the installing efficiency and accuracy, for example, the feeding unit may include a second pushing block 12 and a fourth driving device 13. When the rotatable arm 2 is located at the first position and the LED light bar 4 is located at the rotatable arm 2, the fourth driving device 13 may move the second pushing block 12 along a second direction so that the second pushing block 12 may push the LED light bar 4 along the second direction. Both the first direction and the second direction are parallel to the surface of the rotatable arm for fixing the LED light bar 4 thereon, and as shown in FIG. 2, the first direction is perpendicular to the second direction. X direction in FIG. 2 is the first direction, and Y direction in FIG. 2 is the second direction. The fourth driving device 13 may control the distance of the second pushing block 12 moving in the second direction, so as to control the position of the LED light bar 4 in the second direction. The first direction is perpendicular to the second direction, the position of the LED light bar 4 may be controlled in the second direction, so as to accurately push the LED light bar 4 to the predetermined position on the rotatable arm 2, and it may avoid manual adjustment to the position of the LED light bar 4, and further improve the installing accuracy and efficiency, for example.

The first direction is parallel to a vertical plane, and the second direction is perpendicular to the vertical plane.

To avoid the LED light bar being scratched or damaged during transportation or storage, the LED light bar is usually pasted with a protective film, and it needs to remove the protective film from the LED light bar before installing the LED light bar. The protective film usually has a large area, and a plurality of LED light bars are attached or adhered to a same protective film. In prior art, the protective film is stripped from the LED light bar through manual operation, which has a low efficiency. Therefore, for further improving the efficiency of installing the LED light bar, the apparatus for installing the LED light bar further includes a stripping unit. The stripping unit includes a second driving device (not shown), a first roller 5, a second roller 6 and a steering block 7. The first roller 5 and the second roller 6 are located at a same side of the steering block 7, and both the first roller 5 and the second roller 6 are arranged horizontally. The first roller 5 is located above the steering block 7, and the second roller 6 is located under the steering block 7. One end of the protective film 8 which is not stripped from the LED light bar 4 is wound on the first roller 5, and the other end of the protective film 8 adheres to and passes around the steering block 7, and does not provide support for the LED light bar 4, so that LED light bar 4 is stripped from the protective film 8, and the stripped protective film 8 is wound on the second roller 6. When it operates, the second driving device may rotate the second roller 6. When the second roller 6 rotates, it pulls and winds the protective film 8, and the first roller 5 rotates as the protective film 8 moves. Before the protective film 8 turns direction at the steering block 7, the LED light bar 4 is located above the protective film 8, and the protective film 8 provides support for the LED light bar. When the protective film 8 turns direction at the steering block 7, the protective film 8 gradually rotates to be located above the LED light bar 4, and the protective film 8 does not provides support for the LED light bar 4. Meanwhile, the LED light bar 4 is subjected to its own gravity and an adhesive force of the protective film 8. The adhesive force is small, and the LED light bar 4 can strip from the protective film 8 and fall under action of the gravity. Therefore the protective film 8 can be removed automatically.

Furthermore, the feeding platform 9 is horizontally arranged under the steering block 7, and the LED light bar 4 may fall on the feed platform 9. The automatic stripping and feeding can be achieved.

Figure 3:
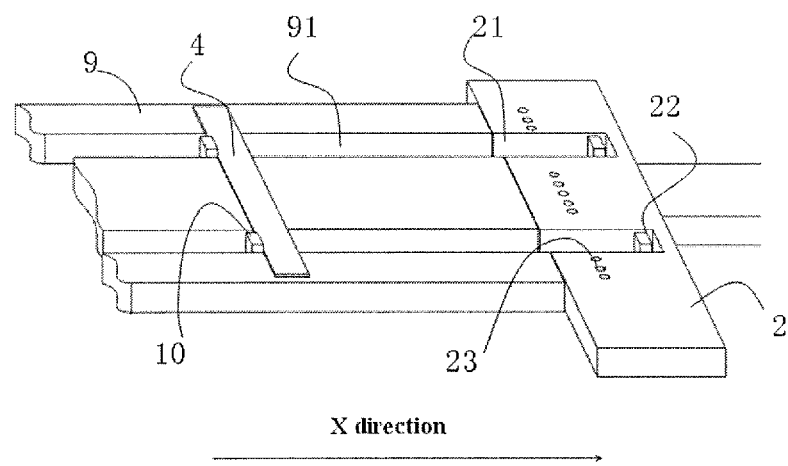
FIG. 3 is a schematically enlarged view showing the joining situation of the feed platform and the rotatable arm in FIG. 2.

For example, as shown in FIG. 3, a first pushing block 10 may slide on the feeding platform 9 in the following manner: a first sliding groove 91 is arranged on the feeding platform 9 along the first direction, and the first pushing block 10 is fit and arranged in the first sliding groove 91; a second sliding groove 21 is arranged on the rotatable arm 2. When the rotatable arm 2 is located at the first position, the rotatable arm 2 is parallel and level with the surface of the feeding platform 9 on which the LED light bar is placed. The first sliding groove 91 abuts, joins or is connected with the second sliding groove 21 of the rotatable arm 2, the second sliding groove 21 is arranged along the first direction, and the first pushing block 10 may slide from the first sliding groove 91 to the second sliding groove 21, to allow the LED light bar 4 moving to a loading platform of the rotatable arm 2. For example, the first direction may be the X direction.

The apparatus for installing the LED light bar further includes a support block 19. The support block 19 is fixed on the feeding platform 9, and the rotatable arm 2 rotates about the fixed end and moves from the first position to the second position in the vertical plane. When the rotatable arm 2 is located at the first position, the rotatable arm 2 is horizontally arranged, and the support block 19 is located under the rotatable arm 2 and supports the rotatable arm 2, configured to prevent the rotatable arm 2 rotating or deforming due to the pressure of the LED light bar 4.

For further improving the installing efficiency and accuracy, and preventing the LED light bar 4 slipping, a first stop block 22 may be arranged on the rotatable arm 2, as shown in FIGS. 2-4. When the LED light bar 4 is located at the predetermined position, the first stop block 22 may stop the LED light bar 4 moving along the first direction, that is, the LED light bar 4 is clamped between the first pushing block 10 and the first stop block 22. Then, the third driving device 11 may move the first pushing block 10 back so that the LED light bar 4 is limited in the first direction to prevent the LED light bar 4 slipping along the first direction, which improves the installing accuracy. It can also reduce additional manual adjustments caused by inaccurately locating, so as to improve the installing efficiency.

A second stop block 92 may also be arranged on the feeding platform 9. As shown in FIGS. 1-2, when the LED light bar 4 is located at the predetermined position, the second stop block 92 may stop the second pushing block 12 moving along the second direction, so that the LED light bar 4 is limited in the second direction to prevent the LED light bar 4 slipping along the second direction, which can improve the installing accuracy. It can also reduce additional manual adjustments caused by inaccurately locating, so as to improve the installing efficiency.

Figures 4A, 4B:
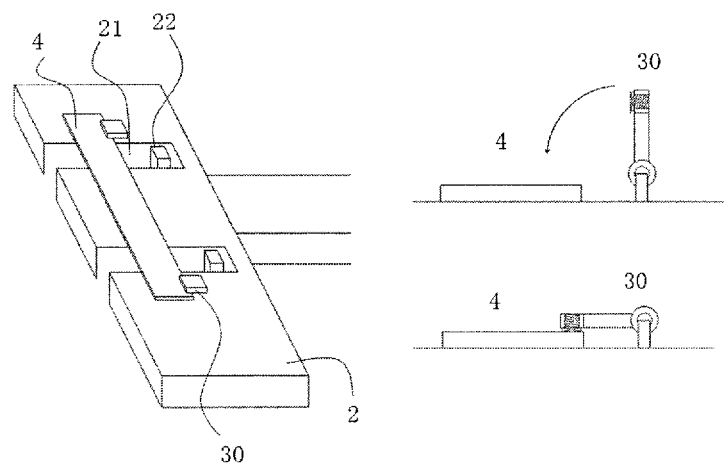
FIGS. 4A-4B are schematic views showing the locating members disposed on the rotatable arm.

The locating member may have a variety of structures, and various locating structures may be disposed at proper positions of the rotatable arm 2 according to different designs of the LED light bar 4. For example, as shown in FIG. 4A, a specific clasp or snap structure 30 (not shown) is arranged on the predetermined position of the rotatable arm 2, and the LED light bar 4 is fixed through snap-fitting with the clasp or snap structure 30; or as shown in FIG. 4B, a rotatable locating structure is disposed on the rotatable arm 2, and the end of the locating structure is provided with a snap structure 30 or the like, by rotating the locating structure, the light bar 4 is located by the snap structure 30; or a groove (not shown) is arranged on the predetermined position of the rotatable arm 2, and the LED light bar 4 is snapped in the groove. The LED light bar 4 may be adsorbed on the predetermined position of the rotatable arm 2 through a pumping device (not shown). The clasp or groove arranged on the rotatable arm 2 affects the movement of the LED light bar 4, the locating member, for example, uses the pumping device to adsorb the LED light bar 4. For example, the locating member includes a pumping device (not shown) and an air hole 23 arranged on the rotatable arm 2. The air hole 23 is located at the predetermined position, and the pumping device communicates with the air hole 23. When the pumping device sucks the air, the LED light bar 4 is adsorbed on the predetermined position, to allow fixing the LED light bar 4. When the LED light bar 4 is snapped into the installing groove of the component, the pumping device stops sucking the air, the LED light bar 4 is no longer fixed on the rotatable arm 2, and the first driving device 3 rotates the rotatable arm 2 back to the first position.

The feeding platform 9 is located below the steering block 7, and the LED light bar 4 needs to move a distance between the steering block 7 and the feeding platform 9 to be on the feeding platform 9. If the distance between the steering block 7 and the feeding platform 9 in the direction of gravity is too large, the LED light bar 4 would impact on the feeding platform 9 at a high speed, and the LED light bar 4 may be deflected or overturned, which affects the final installing accuracy. Therefore, the feeding platform 9 may also include a lifting device 14. The lifting device 14 may lift the feeding platform 9 up or down. When the feeding platform 9 is lifted down to the lowest position, and the rotatable arm 2 is located at the first position, the surface of the feeding platform 9 on which the LED light bar 4 is placed is parallel and level with the rotatable arm 2, the first sliding groove 91 abuts, joins or is connected with the second sliding groove 21. Before the LED light bar 4 falls, the lifting device 14 lifts the feeding platform 9 up so that the feeding platform 9 catches the LED light bar 4 when the LED light bar 4 falls, which equals to a situation of the distance between the feeding platform 9 and the steering block 7 being decreased. It may prevent the LED light bar 4 impacting on the feeding platform 9 at a high speed, so as to avoid the LED light bar 4 being deflected or overturned. When the feeding platform 9 rises a predetermined distance, the feeding platform 9 catches the LED light bar 4, and the lifting device 14 lifts the feeding platform 9 down to the lowest position, and allows the feeding platform 9 to be parallel and level with the rotatable arm 2 located at the first position, so that the first pushing block 10 may be used to feeding. The height of the feeding platform 9 may be adjusted to adapt to different sizes of LED light bars, and it may prevent that the big size of LED light bar cannot fall down to the feeding platform 9.

For automatically lifting the feeding platform 9 up or down, the feeding unit may further include a sensing device 15. When the LED light bar 4 along with the protective film 8 move to the steering block 7, the sensing device 15 is triggered and sends a rising signal to the lifting device 14. The lifting device 14 receives the rising signal, and it may lift the feeding platform 9 up to the predetermined height and then lifts the feeding platform 9 down to the lowest position. Therefore, the position of the LED light bar 4 is automatically determined by the sensing device 15 so that the lifting device 14 lifts the feeding platform 9 up or down. For example, the sensing device may be arranged on a position of the feeding platform 9, which is opposite to the steering block 7.

A first pressure cylinder 16 is arranged between the first roller 5 and the steering block 7. The surface of the first pressure cylinder 16 is configured with multiple bulges 161 along the circumferential direction, and a space between two adjacent bulges 161 may accommodate one LED light bar 4. A width of each bulge 161 in the circumferential direction is equal to a spacing between two adjacent LED light bars 4. The tops of the bulges 161 contact with the surface of the protective film 8 with the LED light bar 4, and presses the protective film 8 towards the steering block 7 so that a wrap angle formed between the protective film 8 and the steering block 7 is reduced, that is, an angle between the protective films 8 at two sides of the steering block 7 is reduced. When the first roller 5 rotates, the first pressure cylinder 16 rotates as the protective film 8 moves, and the LED light bar 4 located at the protective film 8 moves as the protective film 8 moves. At this time, the first pressure cylinder 16 rotates as the protective film 8 moves, the LED light bar 4 enters into the space between the bulges 161 but does not contact with the top of the bulge 161 so that the bulge 161 keeps away from the LED light bar 4. It may prevent the first pressure cylinder 16 squeezing and damaging the LED light bar 4 while the first pressure cylinder 16 normally rotates. Meanwhile, the protective film 8 may keep tension state by adjusting a position of a first pressure cylinder 16 to drive the first roller 5 rotating.

A second pressure cylinder 17 is arranged between the second roller 6 and the steering block 7. The second pressure cylinder 17 contacts with the stripped protection film 8, and the second pressure cylinder 17 presses the protective film 8 towards the steering block 7 so that the wrap angle formed between the protective film 8 and the steering block 7 is further reduced, that is, the angle between the protective films 8 at two sides of the steering block 7 is further reduced, and an angle between the gravity force of the LED light bar 4 and the force of the protective film 8 applying on the LED light bar 4 is increased, and it would be more beneficial to strip the protective film 8 from the LED light bar 4. The protective film 8 may be kept in tension state by adjusting a position of a second pressure cylinder 17 to drive the first roller 5 rotating.

The first pressure cylinder 16 and the second pressure cylinder 17 may be made of rubber material to prevent damaging the protective film 8 and avoid the protective film 8 breaking, and to allow the stripping procedure normally running.

The apparatus for installing the LED light bar can also include a rotating unit 18. The rotating unit 18 may drive the platform 1 to rotate in the horizontal plane. The surface of the platform 1 at which the component is placed is parallel to the horizontal plane. When operating, a plurality of workstations are provided on the platform 1, and each of the workstations is provided with one component. The rotating unit 18 may rotate platform 1 so that the different workstations correspond to the rotatable arm 2 located at the second position. Therefore, it may successively install the LED light bar 4 for a plurality of components so that it avoids frequently placing the components at the platform 1, which can reducing labor intensity and improve the installing efficiency. Furthermore, the platform 1 is configured with a specific fixing device, and the components may be fixed by the fixing device.

The first driving device 3, the second driving device, the third driving device 11, the fourth driving device 13, the lifting device 14 and the rotating unit 18 may be controlled by programming through a same programmable logic controller (PLC).

The following is a method of installing the LED light bar for a light guide plate (not shown) by using the apparatus for installing the LED light bar.

Initial state: one end of the protective film 8 which is not stripped from the LED light bar 4 is wound on the first roller 5, and the other end of the protective film 8 is wound on the second roller 6, the light guide plate is fixed on the platform 1, the rotatable arm 2 is located at the first position and is horizontally arranged.

Stripping procedure: the second driving device may rotate the second roller 6, the protective film 8 moves and turns direction at the steering block 7, and the LED light bar 4 strips from the protective film 8 and falls, while the sensing device 15 sends a rising signal to the lift device to lift the feeding platform 9 up to the predetermined height and then bring the feeding platform 9 down to the lowest position; that is, the feeding platform 9 catches the falling LED light bar 4 and falls down to the lowest position.

Feeding procedure: the third driving device 11 moves the first pushing block 10, the LED light bar 4 is pushed to the rotatable arm 2 along the first direction; after the first stop block 22 stops the LED light bar 4, the third driving device 11 moves the first pushing block 10 back to original position, the fourth driving device 13 moves the second pushing block 12, and the LED light bar 4 is pushed along the second direction; after the second stop block 22 stops the second pushing block 12, the fourth driving device 13 moves the second pushing block 12 back to original position.

Locating procedure: the pumping device sucks airs and the LED light bar 4 is fixed on the rotatable arm 2.

Pressing procedure: the first driving device 3 drives the rotatable arm 2 to rotate about the fixed end and move from a first position to a second position in the vertical plane, while the rotatable arm 2 is horizontally arranged, the LED light bar 4 is pressed into the installing groove of the light guide plate, the pumping device stops sucking airs, the rotatable arm 2 rotates back to the first position, and the rotating unit 18 rotates the platform 1 to prepare for installing the LED light bar for next component.

The present disclosure provides an apparatus for installing the LED light bar. When it operates, the component with a LED light bar to be installed thereon is placed on the surface of the platform, and the rotatable arm is located at the first position, the LED light bar to be installed is placed on the rotatable arm and is fixed by a locating member. After that, the first driving device drives the rotatable arm to rotate about its fixed end and moves from the first position to the second position. When the rotatable arm rotates to the second position, the surface of the rotatable arm on which the LED light bar is fixed is opposite and parallel to the surface of the component with the LED light bar to be installed thereon, the predetermined position is opposite to the groove or adhering region of the component for installing the LED light bar thereon, the LED light bar adheres to the surface of the component with the LED light bar to be installed thereon, the rotatable arm may press the LED light bar in the groove or adhering region of the component for installing the LED light bar thereon so that the LED light bar snaps into the grooves or adheres to the adhering region to assemble the LED light bar with the component, which avoids installing the LED light bar on the component by manual operation, and improves the installing efficiency. It may preset the length of the rotatable arm, the position of fixing the LED light bar on the rotatable arm, and the relative position between the rotatable arm and the platform, and keep them constant, so it is beneficial to locate the LED light bar and improve the installing efficiency. It may keep installing accuracy after being used many times. Therefore, it can improve accuracy and efficiency of installing the LED light bar.

The described above are only exemplary embodiments for explaining the present disclosure, and the present disclosure is not intended to be limited thereto. Various modifications and improvements may be made without departing from the spirit and scope of embodiments of the present disclosure, and all of which shall fall within the protection scope of the present invention.

The present application claims priority of Chinese patent application No. 201510218137.9 filed on Apr. 30, 2015 and entitled "APPARATUS FOR INSTALLING LED LIGHT BAR," the entire contents of which are incorporated herein by reference.

What is claimed is:

1. An apparatus for installing a light-emitting diode (LED) light bar, comprising:
    a platform at which a component with the LED light bar to be installed is placed;
    a rotatable arm and a first driving device disposed on a side of the platform;
    wherein the rotatable arm is provided with a locating member, and one end of the rotatable arm is fixed relative to the platform; and
    the first driving device is configured to drive the rotatable arm to rotate about the fixed end and move from a first position to a second position; under a condition of the rotatable arm being located at the first position, the LED light bar to be installed is placed at the rotatable arm, and the locating member is configured to fix the LED light bar on a predetermined position of the rotatable arm; under a condition of the rotatable arm being located at the second position, a surface of the rotatable arm on which the LED light bar is fixed is opposite and parallel to a surface of the component with the LED light bar to be installed thereon, and the LED light bar attaches to the surface of the component with the LED light bar to be installed thereon; and
    a feeding unit, wherein the feeding unit comprises a feeding platform, a first pushing block and a third driving device;
    wherein the feeding platform is located below a steering block, and the LED light bar can fall on the feeding platform; the first pushing block is slidably connected to the feeding platform; under the condition of the rotatable arm being located at the first position, the third driving device is configured to move the first pushing block along a first direction to allow the first pushing block pushing the LED light bar from the feeding platform to the rotatable arm along the first direction.

2. The apparatus for installing the LED light bar according to claim 1, wherein the feeding unit further comprises: a second pushing block and a fourth driving device;
    wherein under the condition of the rotatable arm being located at the first position and the LED light bar being located at the rotatable arm, the fourth driving device is configured to move the second pushing block along a second direction to allow the second pushing block pushing the LED light bar along the second direction; and
    wherein both the first direction and the second direction are parallel to the surface of the rotatable arm for fixing the LED light bar thereon, and the first direction is perpendicular to the second direction.

3. The apparatus for installing the LED light bar according to claim 2, wherein a second stop block is arranged on the platform; and
    wherein under a condition of the LED light bar being located at the predetermined position, the second stop block is configured to stop the second pushing block moving along the second direction.

4. The apparatus for installing the LED light bar according to claim 2, wherein a first sliding groove is arranged on the feeding platform along the first direction, and the first pushing block is fitly arranged in the first sliding groove; a second sliding groove is arranged on the rotatable arm, at the first position, the rotatable arm is parallel and level with the surface of the feeding platform at which the LED light bar is placed; and
    wherein the first sliding groove is connected with the second sliding groove, and the second sliding groove is arranged along the first direction.

5. The apparatus for installing the LED light bar according to claim 1, further comprising a stripping unit configured to strip a protective film from the LED light bar; wherein the stripping unit includes a second driving device, a first roller, a second roller and a steering block;
    wherein one end of the protective film which is not stripped from the LED light bar is configured to wind on the first roller, and the other end of the protective film is configured to adhere to and pass around the steering block, and then is stripped from the LED light bar, and the stripped protective film is configured to wind on the second roller; and the second driving device is configured to rotate the second roller; and
    wherein the protective film is configured to be gradually wound on the second roller, and the first roller is configured to rotate as the protective film moves under a condition of the second roller rotating.

6. The apparatus for installing the LED light bar according to claim 5, wherein a second pressure cylinder is arranged between the second roller and the steering block, and the second pressure cylinder is configured to contact the stripped protective film, and press the protective film towards the steering block.

7. The apparatus for installing the LED light bar according to claim 5, wherein a first pressure cylinder is arranged between the first roller and the steering block, and the surface of the first pressure cylinder is configured with multiple bulges along the circumferential direction, and a space between two adjacent bulges can accommodate one LED light bar, and a width of each bulge in the circumferential direction is equal to a spacing between two adjacent LED light bars;
    wherein the top of the bulge adheres to the surface of the protective film with the LED light bar, and the protective film is pressed to the steering block; and
    wherein the first pressure cylinder is configured to rotate as the protective film moving under a condition of the first roller rolling.

8. The apparatus for installing the LED light bar according to claim 7, wherein a second pressure cylinder is arranged between the second roller and the steering block, and the second pressure cylinder is configured to contact the stripped protective film, and press the protective film towards the steering block.

9. The apparatus for installing the LED light bar according to claim 1, wherein a first sliding groove is arranged on the feeding platform along the first direction, and the first pushing block is fitly arranged in the first sliding groove; a second sliding groove is arranged on the rotatable arm, at the first position, the rotatable arm is parallel and level with the surface of the feeding platform at which the LED light bar is placed; and wherein the first sliding groove is connected with the second sliding groove, and the second sliding groove is arranged along the first direction.

10. The apparatus for installing the LED light bar according to claim 9, wherein the feeding platform further comprises a lifting device, and the lifting device is configured to lift the feeding platform up or down; and wherein under a condition of the feeding platform being lifted down to the lowest position and the rotatable arm being located at the first position, the surface of the feeding platform at which the LED light bar is placed is parallel and level with the rotatable arm, and the first sliding groove is connected with the second sliding groove.

11. The apparatus for installing the LED light bar according to claim 10, wherein the feeding unit further comprises a sensing device configured to, under a condition of the LED light bar on the protective film moving to the steering block, be triggered and send a rising signal to the lifting device, and the lifting device is configured to receive the rising signal, and lift the feeding platform up to a predetermined height and then lift the feeding platform down to the lowest position.

12. The apparatus for installing the LED light bar according to claim 1, further comprising a support block fixed on the feeding platform, wherein at the first position, the rotatable arm is parallel to the horizontal plane, and the support block is located under the rotatable arm and supports the rotatable arm.

13. The apparatus for installing the LED light bar according to claim 1, wherein a first stop block is arranged on the rotatable arm; and wherein under a condition of the LED light bar being located at the predetermined position, the first stop block is configured to stop the LED light bar moving along the first direction.

14. The apparatus for installing the LED light bar according to claim 1, wherein the locating member comprise a pumping device and a hole arranged on the rotatable arm; and wherein the hole is located at the predetermined position, and the pumping device communicated with the hole, and the LED light bar 4 is adsorbed on the predetermined position through the pumping device.

15. The apparatus for installing the LED light bar according to claim 1, further comprising a rotating unit, and the rotating unit is configured to drive the platform rotating in a horizontal plane, wherein the surface of the platform at which the component is placed is parallel to the horizontal plane.

16. The apparatus for installing the LED light bar according to claim 1, further comprising a stripping unit configured to strip a protective film from the LED light bar; wherein the stripping unit includes a second driving device, a first roller, a second roller and a steering block;

wherein one end of the protective film which is not stripped from the LED light bar is configured to wind on the first roller, and the other end of the protective film is configured to adhere to and pass around the steering block, and then is stripped from the LED light bar, and the stripped protective film is configured to wind on the second roller; and the second driving device is configured to rotate the second roller; and wherein the protective film is configured to be gradually wound on the second roller, and the first roller is configured to rotate as the protective film moves, under a condition of the second roller rotating.

17. A method of installing a light-emitting diode (LED) light bar, comprising:

providing a component with a LED light bar to be installed on a platform, wherein a rotatable arm and a first driving device are disposed on a side of the platform, the rotatable arm is provided with a locating member, and one end of the rotatable arm is fixed relative to the platform; and driving the rotatable arm to rotate about the fixed end of the rotatable arm from a first position to a second position by the first driving device; when the rotatable arm is located at the first position, the LED light bar to be installed is placed at the rotatable arm, and the locating member fixes the LED light bar on a predetermined position of the rotatable arm; when the rotatable arm is located at the second position, a surface of the rotatable arm on which the LED light bar is fixed is opposite and parallel to a surface of the component with the LED light bar to be installed thereon, and the LED light bar is attached to the surface of the component with the LED light bar to be installed thereon; and providing a feeding unit, wherein the feeding unit includes a feeding platform, a first pushing block and a third driving device, wherein the first pushing block is slidably connected to the feeding platform, and the feeding platform is located below a steering block;

when the rotatable arm is located at the first position, the third driving device can move the first pushing block along a first direction to allow the first pushing block pushing the LED light bar from the feeding platform to the rotatable arm along the first direction.

18. The method of installing the LED light bar according to claim 17, wherein the feeding unit further comprises a second pushing block and a fourth driving device;

wherein when the rotatable arm being is located at the first position and the LED light bar is located at the rotatable arm, the fourth driving device can move the second pushing block along a second direction to allow the second pushing block pushing the LED light bar along the second direction; and wherein both the first direction and the second direction are parallel to the surface of the rotatable arm for fixing the LED light bar thereon, and the first direction is perpendicular to the second direction.

\* \* \* \* \*